(12) United States Patent
Chen et al.

(10) Patent No.: US 11,114,477 B2
(45) Date of Patent: Sep. 7, 2021

(54) ARRAY SUBSTRATE AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventors: Caiqin Chen, Wuhan (CN); Xing Ming, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 517 days.

(21) Appl. No.: 16/094,315

(22) PCT Filed: Aug. 23, 2018

(86) PCT No.: PCT/CN2018/101962
§ 371 (c)(1),
(2) Date: Oct. 17, 2018

(87) PCT Pub. No.: WO2020/006831
PCT Pub. Date: Jan. 9, 2020

(65) Prior Publication Data
US 2021/0233941 A1    Jul. 29, 2021

(30) Foreign Application Priority Data

Jul. 4, 2018  (CN) .......................... 201810726708.3

(51) Int. Cl.
*H01L 27/12* (2006.01)
*H01L 29/786* (2006.01)
(Continued)

(52) U.S. Cl.
CPC ........ *H01L 27/1288* (2013.01); *H01L 27/124* (2013.01); *H01L 27/1218* (2013.01);
(Continued)

(58) Field of Classification Search
CPC ............. H01L 27/1288; H01L 27/1218; H01L 27/1222; H01L 27/124; H01L 27/1248;
(Continued)

(56) References Cited

U.S. PATENT DOCUMENTS

2007/0285591 A1* 12/2007 Moh ................. G02F 1/136213
                                                              349/42
2008/0084364 A1*  4/2008 Bae ..................... H01L 27/1214
                                                              345/55
(Continued)

FOREIGN PATENT DOCUMENTS

| CN | 103681659 A | 3/2014 |
| CN | 107845643 A | 3/2018 |
| CN | 107946317 A | 4/2018 |

Primary Examiner — Dzung Tran
(74) Attorney, Agent, or Firm — Kirton McConkie; Evan R. Witt

(57) ABSTRACT

In a method for manufacturing an array substrate, a first photoresist pattern is formed on a buffer layer of a non-display region and the buffer layer uncovered by the first photoresist pattern is removed to form a first via hole in the non-display region. A second via hole is formed on the basis of the first via hole. The second via hole is connected to the first via hole. By forming the first via hole in the non-display region and forming the second via hole on the basis of the first via hole, completeness of film layers is ensured and product yield is improved.

12 Claims, 6 Drawing Sheets

(51) Int. Cl.
  *H01L 29/66*  (2006.01)
  *H01L 27/32*  (2006.01)
  *H01L 51/00*  (2006.01)
  *H01L 51/56*  (2006.01)

(52) U.S. Cl.
  CPC ...... *H01L 27/1222* (2013.01); *H01L 27/1248* (2013.01); *H01L 27/1274* (2013.01); *H01L 29/66757* (2013.01); *H01L 29/78675* (2013.01); *H01L 27/3246* (2013.01); *H01L 27/3262* (2013.01); *H01L 27/3276* (2013.01); *H01L 51/0097* (2013.01); *H01L 51/56* (2013.01); *H01L 2227/323* (2013.01); *H01L 2251/5338* (2013.01)

(58) Field of Classification Search
  CPC ............. H01L 27/1274; H01L 27/3246; H01L 2227/323
  USPC ......................................................... 257/72
  See application file for complete search history.

(56) References Cited

U.S. PATENT DOCUMENTS

| | | | |
|---|---|---|---|
| 2009/0184315 A1* | 7/2009 | Lee ..................... | H01L 29/4908 257/43 |
| 2011/0156027 A1* | 6/2011 | Yamazaki ......... | H01L 27/11551 257/43 |
| 2013/0037812 A1* | 2/2013 | Park .................... | H01L 29/4908 257/59 |
| 2015/0243681 A1 | 8/2015 | Sung et al. | |
| 2016/0027813 A1 | 1/2016 | Xu et al. | |
| 2019/0157311 A1 | 5/2019 | Zhang | |

* cited by examiner

ARRAY SUBSTRATE AND MANUFACTURING METHOD THEREOF

CROSS REFERENCE TO RELATED APPLICATION

This application is a National Stage of International Application No. PCT/CN2018/101962, filed on Aug. 23, 2018, which claims priority to Chinese Application No. 201810726708.3, filled on Jul. 4, 2018. The entire disclosures of each of the applications are incorporated herein by reference.

BACKGROUND

1. Field of the Disclosure

The present disclosure relates to display technologies, and more particularly, to an array substrate and a manufacturing method thereof.

2. Description of Related Art

In recent years, low temperature poly-silicon (LTPS) technologies are gradually developed. It is beneficial to increase aperture ratio, increase brightness of displays, and lower power consumption for the liquid crystal panels producing using the LTPS technologies, and it is suitable for manufacturing products with lightweight, low power consumption, and high resolution.

Currently, a LTPS process of a flexible and foldable active-matrix organic light emitting diode (AMOLED) needs twelve procedures. It primarily utilizes lithography or dry etching to etch the inorganic thin films with poor stress or less flexibility in peripheral non-displayed foldable regions and fill it with an organic polyimide resin material having better flexibility. Since the lithography or dry etching is utilized in the process to etch the inorganic thin films with poor stress or less flexibility in the foldable regions. It is easily to cause film damage at peripheral areas of the inorganic thin films. This cannot ensure completeness of film layers, thereby lowering product yield.

SUMMARY

Embodiments of the present disclosure provide a method for manufacturing an array substrate, which can ensure completeness of film layers and improve product yield.

The technical schemes provided in the present disclosure are described below.

The present disclosure provides a method for manufacturing an array substrate, including:

forming a buffer layer on a substrate, the substrate including a display region and a non-display region;

forming a first photoresist pattern on the buffer layer of the non-display region and removing the buffer layer uncovered by the first photoresist pattern to form a first via hole in the non-display region;

forming an insulating layer on the buffer layer of the non-display region and the first via hole; and forming a second photoresist pattern on the insulating layer of the non-display region and removing the insulating layer uncovered by the second photoresist pattern to form a second via hole in the non-display region, the second photoresist pattern corresponding to the first via hole and the second via hole connected to the first via hole, wherein the insulating layer at least partially covers the first via hole and a cross-sectional area of the second via hole is less than or equal to a cross-sectional area of the first via hole, and wherein a thickness of the first via hole is between 0.7 micrometer and 0.9 micrometer and a thickness of the second via hole is between 0.6 micrometer and 0.8 micrometer.

In accordance with a preferred embodiment of the present disclosure, after the step of removing the insulating layer uncovered by the second photoresist pattern to form the second via hole in the non-display region, the method further includes:

filling an organic material into the first via hole and the second via hole to form an organic insulating layer in the first via hole and the second via hole, wherein the organic insulating layer contacts the substrate via the first via hole and the second via hole; and sequentially forming a metal layer, an organic flat layer, and a pixel defining layer on the organic insulating layer.

In accordance with a preferred embodiment of the present disclosure, the step of forming the first photoresist pattern on the buffer layer of the non-display region and removing the buffer layer uncovered by the first photoresist pattern to form the first via hole in the non-display region includes:

forming a first photoresist layer on the buffer layer of the non-display region and processing the first photoresist layer by exposure and development to form the first photoresist pattern on the buffer layer of the non-display region; and etching the buffer layer uncovered by the first photoresist pattern to form the first via hole in the non-display region.

In accordance with a preferred embodiment of the present disclosure, the step of forming the second photoresist pattern on the insulating layer of the non-display region and removing the insulating layer uncovered by the second photoresist pattern to form the second via hole in the non-display region includes:

forming a second photoresist layer on the insulating layer of the non-display region and processing the second photoresist layer by exposure and development to form the second photoresist pattern on the insulating layer of the non-display region; and etching the insulating layer uncovered by the second photoresist pattern to form the second via hole in the non-display region.

In accordance with a preferred embodiment of the present disclosure, the method further includes:

sequentially forming a thin-film transistor pattern and the insulating layer on the buffer layer of the display region;

forming the second photoresist layer on the insulating layer and processing the second photoresist layer by the exposure and the development to form a third photoresist pattern and a fourth photoresist pattern on the insulating layer of the display region; and removing the insulating layer uncovered by the third photoresist pattern and the fourth photoresist pattern to form a third via hole and a fourth via hole in the display region, wherein the third via hole and the fourth via hole run through the thin-film transistor pattern and the insulating layer and are disposed at two sides of the thin-film transistor pattern, wherein a source electrode is formed in the third via hole, a drain electrode is formed in the fourth via hole, and the source electrode and the drain electrode at least covers a part of the insulating layer, and wherein an organic flat layer, an anode, a pixel defining layer, and a spacer are sequentially formed on the source electrode and the drain electrode.

In accordance with a preferred embodiment of the present disclosure, the insulating layer is made of polyimide resin or poly(methyl methacrylate).

In accordance with a preferred embodiment of the present disclosure, a flexible material is filled into the first via hole and the second via hole to increase flexibility of the array substrate.

The present disclosure provides a method for manufacturing an array substrate, including:

forming a buffer layer on a substrate, the substrate including a display region and a non-display region;

forming a first photoresist pattern on the buffer layer of the non-display region and removing the buffer layer uncovered by the first photoresist pattern to form a first via hole in the non-display region;

forming an insulating layer on the buffer layer of the non-display region and the first via hole; and forming a second photoresist pattern on the insulating layer of the non-display region and removing the insulating layer uncovered by the second photoresist pattern to form a second via hole in the non-display region, wherein the second photoresist pattern corresponds to the first via hole and the second via hole is connected to the first via hole.

After the step of removing the insulating layer uncovered by the second photoresist pattern to form the second via hole in the non-display region, the method further includes:

filling an organic material into the first via hole and the second via hole to form an organic insulating layer in the first via hole and the second via hole, wherein the organic insulating layer contacts the substrate via the first via hole and the second via hole; and sequentially forming a metal layer, an organic flat layer, and a pixel defining layer on the organic insulating layer.

The step of forming the first photoresist pattern on the buffer layer of the non-display region and removing the buffer layer uncovered by the first photoresist pattern to form the first via hole in the non-display region includes:

forming a first photoresist layer on the buffer layer of the non-display region and processing the first photoresist layer by exposure and development to form the first photoresist pattern on the buffer layer of the non-display region; and etching the buffer layer uncovered by the first photoresist pattern to form the first via hole in the non-display region.

the step of forming the second photoresist pattern on the insulating layer of the non-display region and removing the insulating layer uncovered by the second photoresist pattern to form the second via hole in the non-display region includes:

forming a second photoresist layer on the insulating layer of the non-display region and processing the second photoresist layer by exposure and development to form the second photoresist pattern on the insulating layer of the non-display region; and etching the insulating layer uncovered by the second photoresist pattern to form the second via hole in the non-display region.

In accordance with a preferred embodiment of the present disclosure, the method further includes:

sequentially forming a thin-film transistor pattern and the insulating layer on the buffer layer of the display region;

forming the second photoresist layer on the insulating layer and processing the second photoresist layer by the exposure and the development to form a third photoresist pattern and a fourth photoresist pattern on the insulating layer of the display region; and removing the insulating layer uncovered by the third photoresist pattern and the fourth photoresist pattern to form a third via hole and a fourth via hole in the display region, wherein the third via hole and the fourth via hole run through the thin-film transistor pattern and the insulating layer and are disposed at two sides of the thin-film transistor pattern, wherein a source electrode is formed in the third via hole, a drain electrode is formed in the fourth via hole, and the source electrode and the drain electrode at least covers a part of the insulating layer, and wherein an organic flat layer, an anode, a pixel defining layer, and a spacer are sequentially formed on the source electrode and the drain electrode.

Correspondingly, the present disclosure further provides an array substrate including:

a substrate including a display region and a non-display region; and a buffer layer and an insulating layer that are laminated and disposed in the non-display region, wherein a first via hole is disposed in the buffer layer, a second via hole is disposed in the insulating layer, and the second via hole is connected to the first via hole.

In accordance with a preferred embodiment of the present disclosure, the buffer layer, a thin-film transistor pattern, and the insulating layer that are laminated and disposed in the display region;

a third via hole and a fourth via hole, the third via hole and the fourth via hole penetrating the thin-film transistor pattern and the insulating layer and disposed at two sides of the thin-film transistor pattern, wherein a source electrode is formed in the third via hole, a drain electrode is formed in the fourth via hole, and the source electrode and the drain electrode at least covers a part of the insulating layer; and an organic flat layer, an anode, a pixel defining layer, and a spacer that are laminated and disposed on the source electrode and the drain electrode, the organic flat layer covering the source electrode and the drain electrode.

In accordance with a preferred embodiment of the present disclosure, the insulating layer at least partially covers the first via hole and a cross-sectional area of the second via hole is less than or equal to a cross-sectional area of the first via hole.

In accordance with a preferred embodiment of the present disclosure, a thickness of the first via hole is between 0.7 micrometer and 0.9 micrometer and a thickness of the second via hole is between 0.6 micrometer and 0.8 micrometer.

In accordance with a preferred embodiment of the present disclosure, the insulating layer is made of polyimide resin or poly(methyl methacrylate).

Beneficial effects of the present disclosure are provided below. By forming the first via hole in the non-display region and forming the second via hole on the basis of the first via hole, completeness of film layers is ensured, thereby improving product yield.

BRIEF DESCRIPTION OF DRAWINGS

For explaining the technical schemes used in the conventional skills and the embodiments of the present invention more clearly, the drawings to be used in the embodiments or the descriptions on the conventional skills will be briefly introduced in the following. Obviously, the drawings below are only some embodiments of the present invention, and those of ordinary skill in the art can further obtain other drawings according to these drawings without making any inventive effort.

DETAILED DESCRIPTION OF PREFERRED EMBODIMENTS

Figure 1:
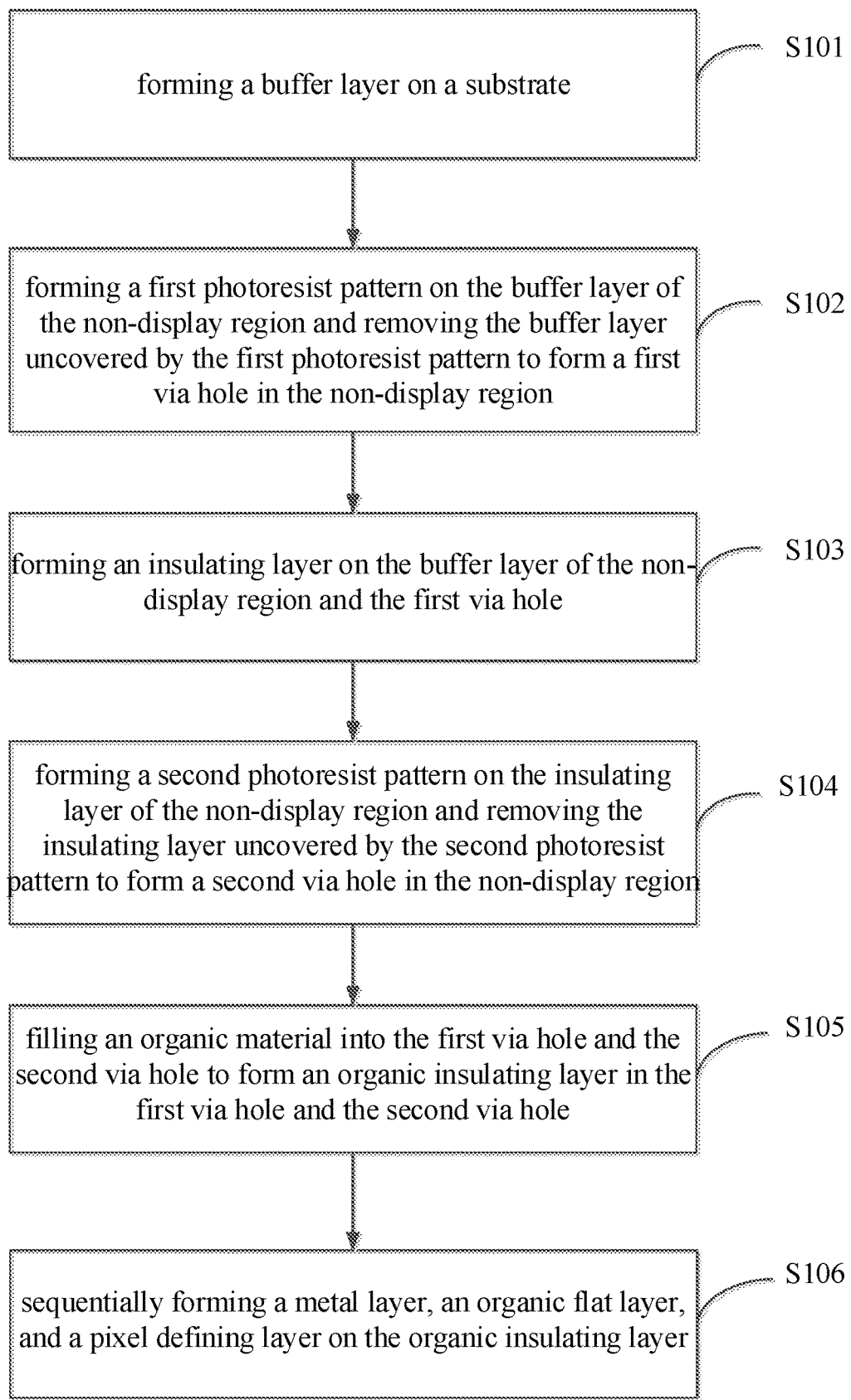
FIG. 1 is a schematic diagram illustrating steps of a method for manufacturing an array substrate provided in accordance with embodiments of the present disclosure.

The embodiments of the present disclosure will be described in detail below. The embodiments are illustrated in the appending drawings, in which the same or similar reference numbers are throughout referred to as the same or similar components or the components having the same or similar functions. The embodiments described below with reference to the appending drawings are exemplary and are merely used to illustrate the present disclosure, and should not be construed as limitations of the present disclosure.

In the description of the present disclosure, it is to be understood that the terms "center", "longitudinal", "lateral", "length", "width", "thickness", "upper", "lower", "front", "rear", "left", "right". "vertical", "horizontal", "top", "bottom", "inner", "outer", "clockwise", "counterclockwise" and the like indicated orientation or positional relationship based on the relationship of the position or orientation shown in the drawings, which is only for the purpose of facilitating describing the description and simplifying the description, but is not intended or implied that the device or element referred to must have a specific orientation, and be constructed and operated in a particular orientation. Therefore, it should not be understood as a limitation of the present disclosure. In addition, terms such as "first" and "second" are used herein for purposes of description and are not intended to indicate or imply relative importance or imply the number of features. Thus, the feature defined with "first" and "second" may include one or more of this feature. In the description of the present disclosure, "a plurality of" means two or more than two, unless specified otherwise.

In the description of the present disclosure, it is noted that unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above" or "on top of" a second feature may include an embodiment in which the first feature is right or obliquely "on," "above" or "on top of" the second feature, or just means that the first feature is at a height higher than that of the second feature; while a first feature "below," "under" or "on bottom of" a second feature may include an embodiment in which the first feature is right or obliquely "below," "under" or "on bottom of" the second feature, or just means that the first feature is at a height lower than that of the second feature.

The following disclosure provides many different embodiments or examples to implement different structures of the present disclosure. In order to simplify the present disclosure, the components and arrangements of specific examples are described in the following. Apparently, they are just exemplary, and do not intend to limit the present disclosure. In addition, reference numbers and/or letters can be repeated in different examples of the present disclosure for the purposes of simplification and clearness, without indicating the relationships between the discussed embodiments and/or arrangements. Further, the present disclosure provides examples of various specific processes and materials, but an ordinary person in the art can realize the availability of other processes and/or usage of other materials.

FIG. 1 is a schematic diagram illustrating steps of a method for manufacturing an array substrate provided in accordance with embodiments of the present disclosure.

The method for manufacturing the array substrate, provided in the embodiments of the present disclosure, includes the following steps.

In Step S101, a buffer layer is formed on a substrate.

In Step S102, a first photoresist pattern is formed on the buffer layer of a non-display region and the buffer layer uncovered by the first photoresist pattern is removed to form a first via hole in the non-display region.

In Step S103, an insulating layer is formed on the buffer layer of the non-display region and the first via hole.

In Step S104, a second photoresist pattern is formed on the insulating layer of the non-display region and the insulating layer uncovered by the second photoresist pattern is removed to form a second via hole in the non-display region.

In Step S105, an organic material is filled into the first via hole and the second via hole to form an organic insulating layer in the first via hole and the second via hole.

In Step S106, a metal layer, an organic flat layer, and a pixel defining layer are sequentially formed on the organic insulating layer.

Figure 2:
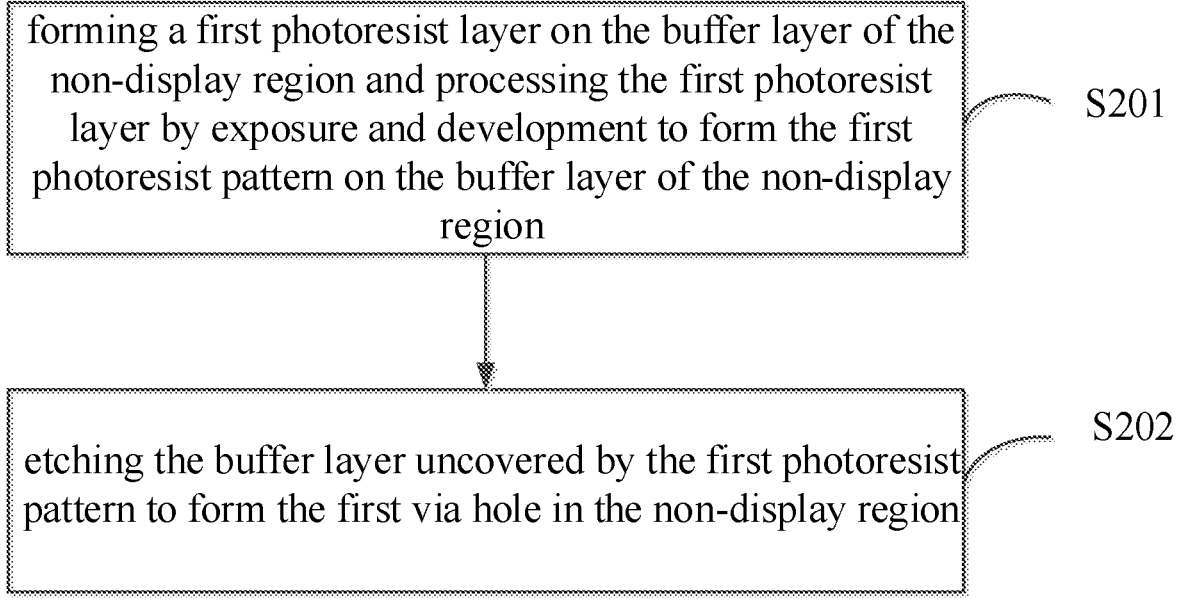
FIG. 2 is a flowchart of Step S102 in the method for manufacturing the array substrate provided in accordance with embodiments of the present disclosure.
Figure 3:
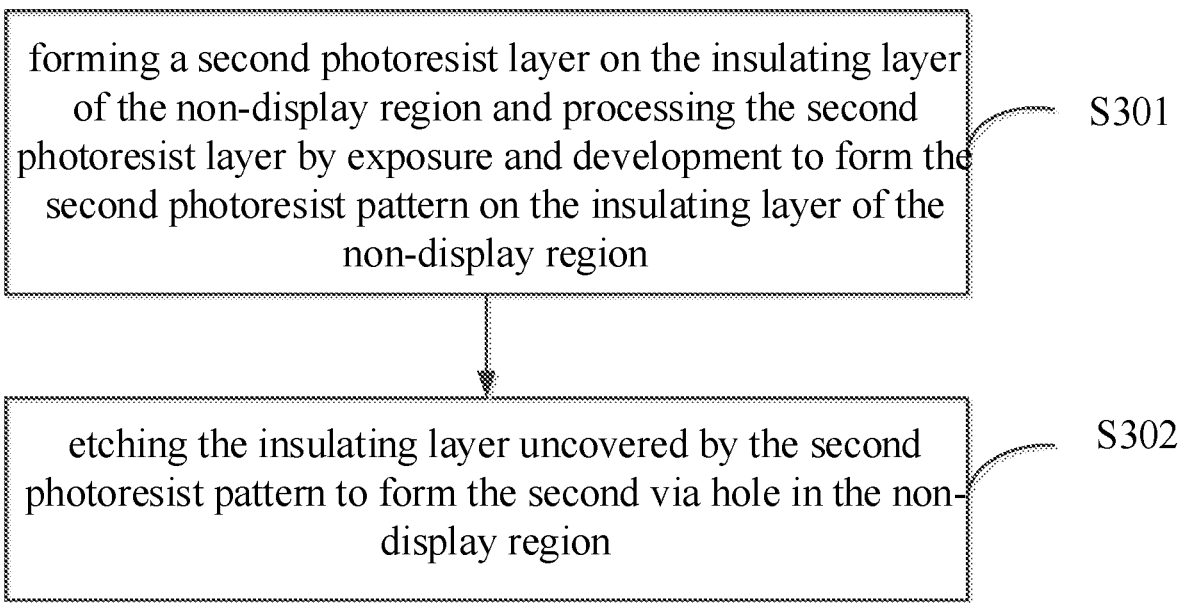
FIG. 3 is a flowchart of Step S104 in the method for manufacturing the array substrate provided in accordance with embodiments of the present disclosure.

Referring to FIGS. 1 to 3 with reference to FIGS. 5 to 8, in Step S101, an organic buffer layer is formed on the substrate. For instance, a glass substrate 10 is provided. The glass substrate 10 includes a display region 101 and a non-display region 102. A layer of an organic buffer material is deposited on the glass substrate 10 to form the organic buffer layer 20. The organic buffer layer 20 is configured to shield poor results from a glass substrate with drawbacks itself. Generally, the buffer layer 20 can be formed by depositing a silicon dioxide material using plasma chemical vapor deposition.

In Step S102, a first photoresist pattern is formed on the organic buffer layer 20 of the non-display region 102 and the organic buffer layer 20 uncovered by the first photoresist pattern is removed to form a first via hole 201 in the non-display region 102. Specifically, the substrate 10 having the organic buffer layer 20 formed in Step S101 may be utilized. A layer of photoresist (not shown) is coated on the organic buffer layer 20 of the non-display region 102 of the glass substrate 10 and the photoresist is processed by exposure and development to form the first photoresist pattern (not shown) on the organic buffer layer 20 of the non-display region 102 of the glass substrate 10. After that, an etching process is utilized to remove the organic buffer layer 20 uncovered by the first photoresist pattern to form the first via hole 201 in the non-display region 102. It is noted that the photoresist can be positive photoresist and can also be negative photoresist. In addition, details of the formed first photoresist pattern depend on practical situations.

In Step S103, an insulating layer 30 is formed on the organic buffer layer 20 of the non-display region 102 and the first via hole 201. Specifically, the glass substrate 10 in Step S102 may be utilized. The insulating layer 30 is formed on the organic buffer layer 20 and the first via hole in the non-display region 102 of the glass substrate 10 by chemical vapor deposition. The material of the insulating layer 30 can be silica, silicon nitride, or aluminum oxide.

In Step S104, a second photoresist pattern (not shown) is formed on the insulating layer 30 of the non-display region 102 and the insulating layer 30 uncovered by the second photoresist pattern is removed to form a second via hole 306 in the non-display region 102. For example, the glass substrate 10 having the first via hole 201 and the insulating layer 30 that are formed in Step S103 is utilized. A layer of photoresist is coated on the insulating layer 30 of the non-display region 102 of the glass substrate 10. By exposure and development, the second photoresist pattern is formed on the insulating layer 30 of the non-display region 102 of the glass substrate 10. After that, an etching process is utilized to remove the insulating layer 30 uncovered by the second photoresist pattern to form the second via hole 306 in the non-display region 102. It is noted that a projection of the first via hole onto the glass substrate 10 is consistent with a projection of the second photoresist pattern onto the substrate 10. That is, the second photoresist pattern corresponds to the first via hole 201 and the second via hole 306 is connected to the first via hole 201.

In Step S105, an organic material is filled into the first via hole 201 and the second via hole 306 to form an organic insulating layer 50 in the first via hole 201 and the second via hole 306. The organic insulating layer 50 contacts the substrate 10 via the first via hole 201 and the second via hole 306. Specifically, after the first via hole 201 and the second via hole 306 are manufactured, a flexible material can be filled into the first via hole 201 and the second via hole 306 to increase flexibility of the non-display region 102 of the glass substrate 10.

It is noted that a sum of the thickness of the organic buffer layer 20 and the thickness of the insulating layer 30 is greater than 1.5 micrometer. Since the overall film thickness of the organic buffer layer 20 and the insulating layer 30 is relatively greater than any single one of the organic buffer layer 20 and the insulating layer 30, overdevelopment or underdevelopment is easily occurred during a development process if only one photoresist process is adopted to etch both of the organic buffer layer 20 and the insulating layer 30. In overdevelopment situations, remained photoresist patterns is relatively thin. In the etching process, etching solution will etch the film layers that are not required to be etched, resulting in film damage. This affects completeness of film patterns and lowers product yield. In underdevelopment situations, the photoresist required to be removed remains on the substrate. This affects the manufacturing process, thereby lowering product yield.

Figure 9:
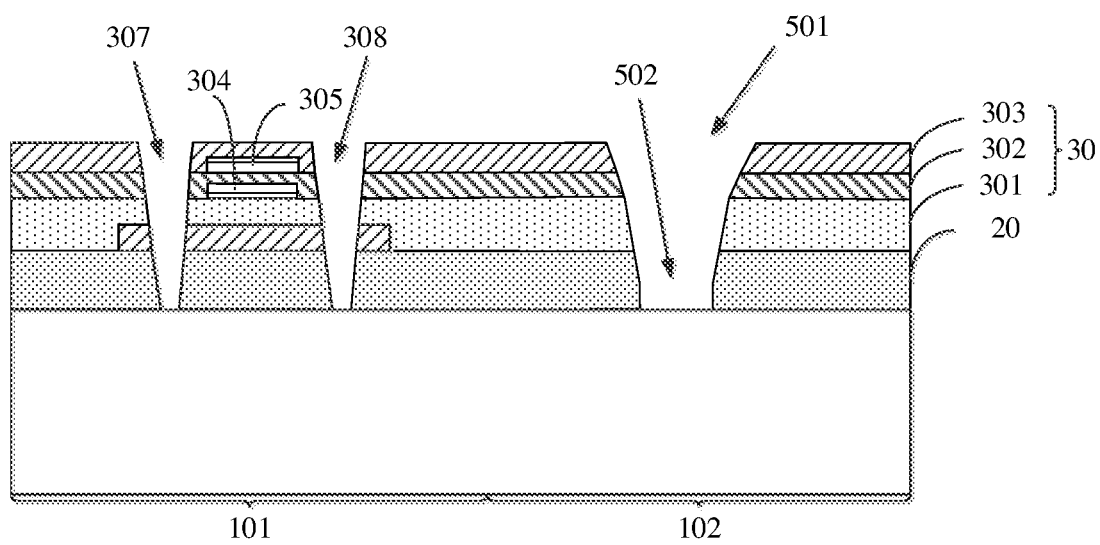
FIG. 9 is a schematic diagram illustrating manufacture of an array substrate in the existing arts.

Referring to FIG. 9, in an existing art, after the insulating layer 30 is manufactured, a lithographic process is performed to a third insulating layer 303 and a second insulating layer 302 of the insulating layer 30 to form a first deep hole 501. After that, on the basis of the first deep hole 501, another lithographic process is performed to a first insulating layer 301 and the organic buffer layer 20 to form a second deep hole 502. In forming the second deep hole 502, it is required to coat a layer of photoresist on the first insulating layer 301 and the organic buffer layer 20 to protect a part of the first insulating layer 301 and the organic buffer layer 20 that is needless to be etched. In forming the first deep hole 501, a part of the second insulating layer 302 will remain. Also, in order to ensure that the size of the second deep hole 502 reaches a preset size, the cross-sectional area of the first deep hole 501 will be slightly greater than the cross-sectional area of the second deep hole 502. However, this will make a part of the third insulating layer 303 and the second insulating layer 302, that is needless to be etched, be etched, resulting in film damage. This affects completeness of film patterns and lowers product yield.

In the present embodiment, the first via hole 201 is formed on the organic buffer layer 20 and then the second via hole 306 is formed on the basis of the first via hole 201. This ensures completeness of the film layers, thereby improving product yield.

FIG. 2 is a flowchart of Step S102 in the method for manufacturing the array substrate provided in accordance with embodiments of the present disclosure. As shown in FIG. 2, Step S102 includes the followings.

In Step S201, a first photoresist layer is formed on the organic buffer layer of the non-display region and the first photoresist layer is processed by exposure and development to form the first photoresist pattern on the buffer layer of the non-display region.

In Step S202, the buffer layer uncovered by the first photoresist pattern is etched to form the first via hole in the non-display region.

Figure 5:
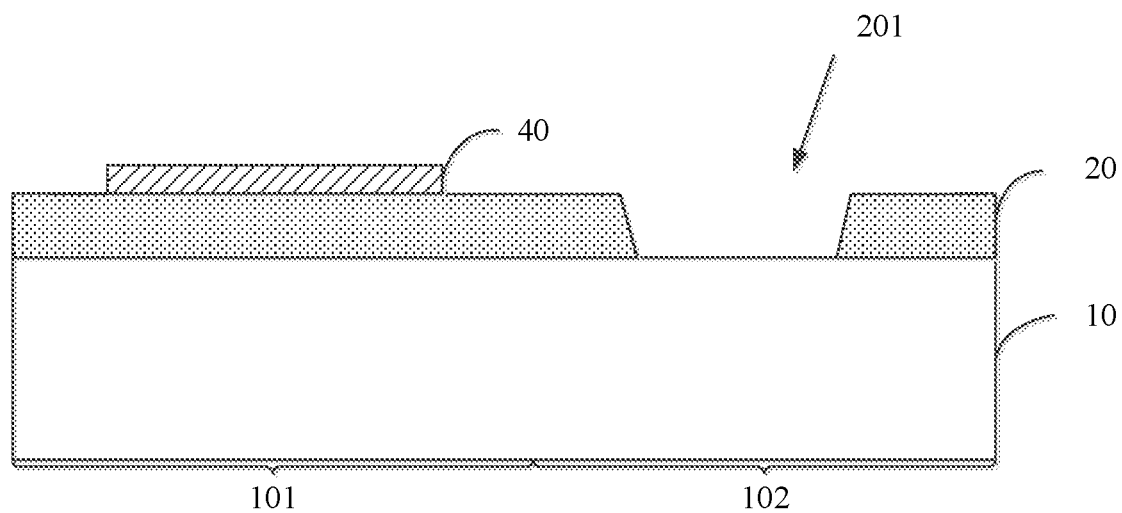
FIGS. 5 to 8 are schematic diagrams illustrating an array substrate provided in accordance with embodiments of the present disclosure.

Referring to FIGS. 2 and 5, for example, a layer of photoresist is coated on the organic buffer layer 20 of the non-display region 102 of the glass substrate 10. The photoresist can be positive photoresist. Next, the exposure and the development are performed to the photoresist using one mask such that the first photoresist pattern (not shown) is formed on the organic buffer layer 20 of the non-display region 102. After that, dry etching is utilized to etch and remove the organic buffer layer 20 uncovered by the first photoresist pattern to form the first via hole 201 in the organic buffer layer 20 of the non-display region 102 of the glass substrate 10. It is noted that the mask includes fully-transparent regions and opaque regions. A projection of the opaque regions onto the photoresist coincides with the first photoresist pattern.

FIG. 3 is a flowchart of Step S104 in the method for manufacturing the array substrate provided in accordance with embodiments of the present disclosure. As shown in FIG. 3, Step S104 includes the followings.

In Step S301, a second photoresist layer is formed on the insulating layer of the non-display region and the second photoresist layer is processed by exposure and development to form the second photoresist pattern on the insulating layer of the non-display region.

In Step S302, the insulating layer uncovered by the second photoresist pattern is etched to form the second via hole in the non-display region.

Figure 6:
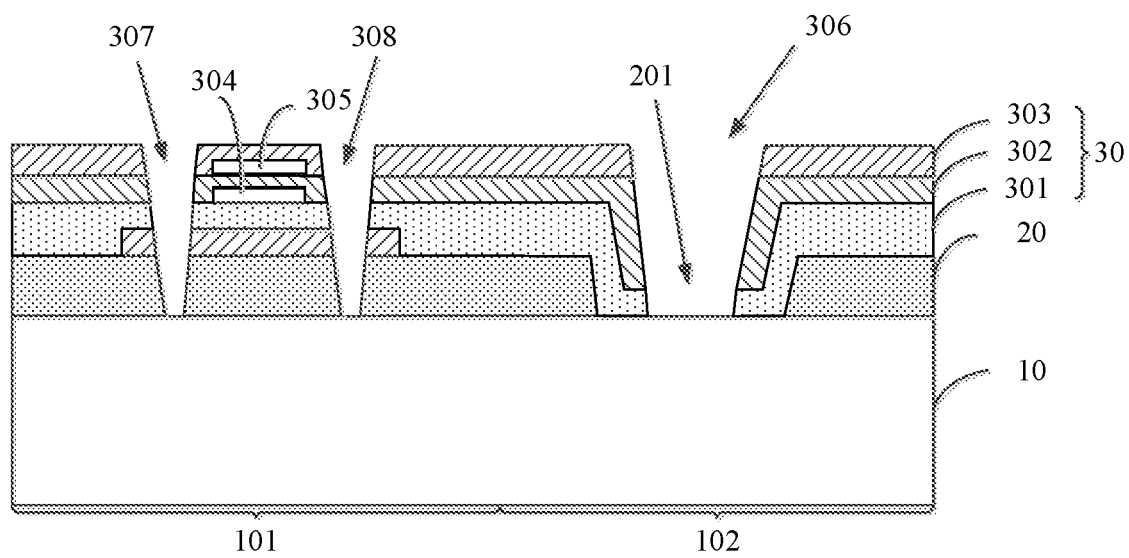

Specifically, referring to FIGS. 3 and 6, in Step S301, photoresist is coated on the insulating layer of the non-display region 102 using a spin coating approach such that a second photoresist layer (not shown) is formed on the insulating layer of the non-display region 102. After that, another mask is utilized. The mask includes light-blocking regions and transparent regions (both of them are not shown). The light-blocking regions correspond to the second photoresist pattern. The exposure and the development are performed to the second photoresist layer to form the second photoresist pattern on the insulating layer 30 of the non-display region 102. After that, dry etching is utilized to etch the insulating layer 30 uncovered by the second photoresist pattern to form the second via hole 306 in the non-display region 102.

Figure 4:
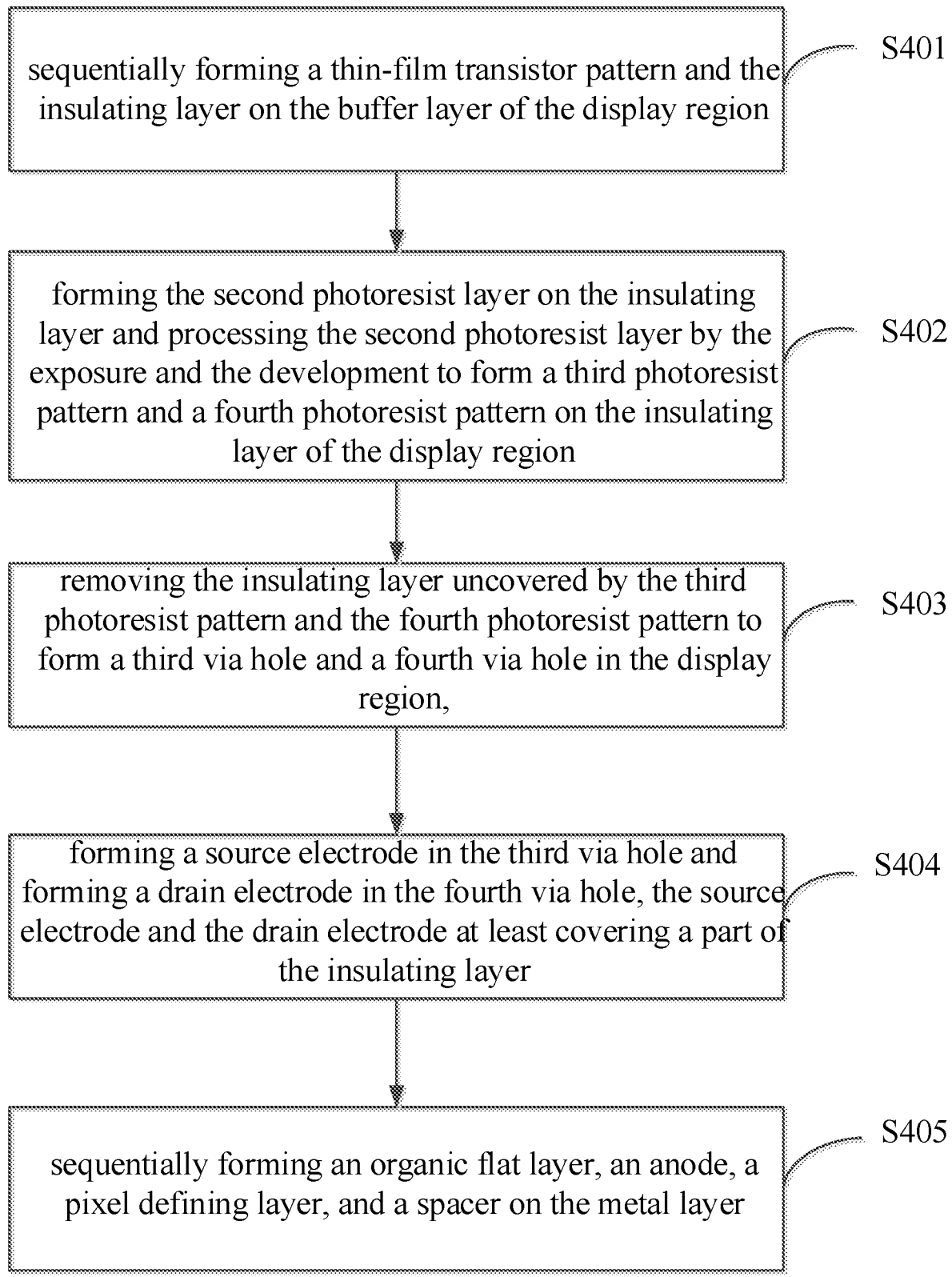
FIG. 4 is a schematic diagram illustrating steps of a method for manufacturing an array substrate provided in accordance with a preferred embodiment of the present disclosure.

FIG. 4 is a schematic diagram illustrating steps of a method for manufacturing an array substrate provided in accordance with a preferred embodiment of the present disclosure.

Preferably, the method for manufacturing the array substrate includes the following steps:

In Step S401, a thin-film transistor pattern and an insulating layer are sequentially formed on an organic buffer layer of the display region.

In Step S402, a second photoresist layer is formed on the insulating layer and the second photoresist layer is processed by exposure and development to form a third photoresist pattern and a fourth photoresist pattern on the insulating layer of the display region.

In Step S403, the insulating layer uncovered by the third photoresist pattern and the fourth photoresist pattern is removed to form a third via hole and a fourth via hole in the display region.

In Step S404, a source electrode is formed in the third via hole, a drain electrode is formed in the fourth via hole, and the source electrode and the drain electrode at least covers a part of the insulating layer.

In Step S405, an organic flat layer, an anode, a pixel defining layer, and a spacer are sequentially formed on the metal layer.

Figure 7:
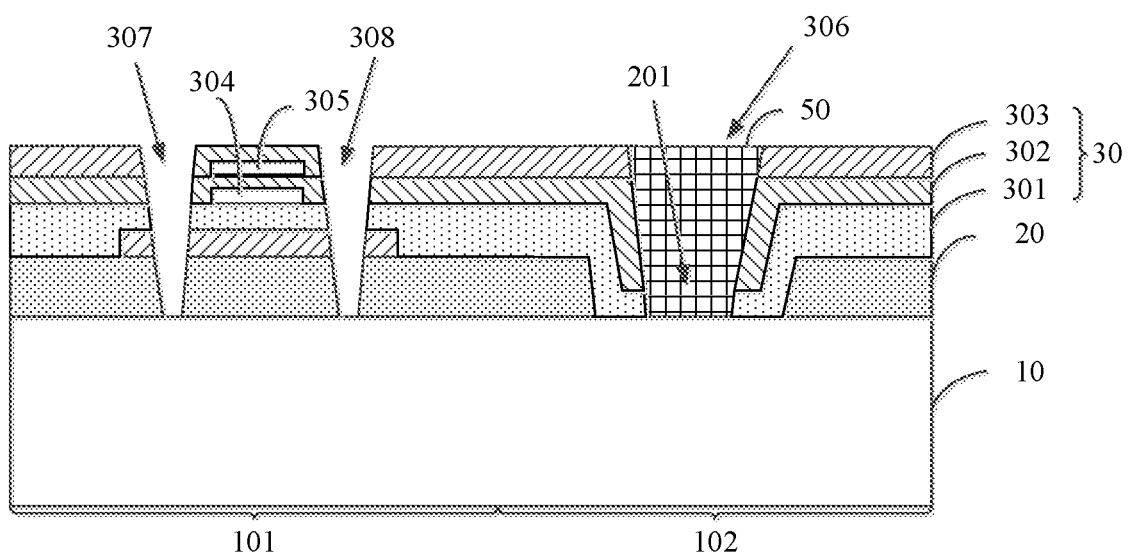
Figure 8:
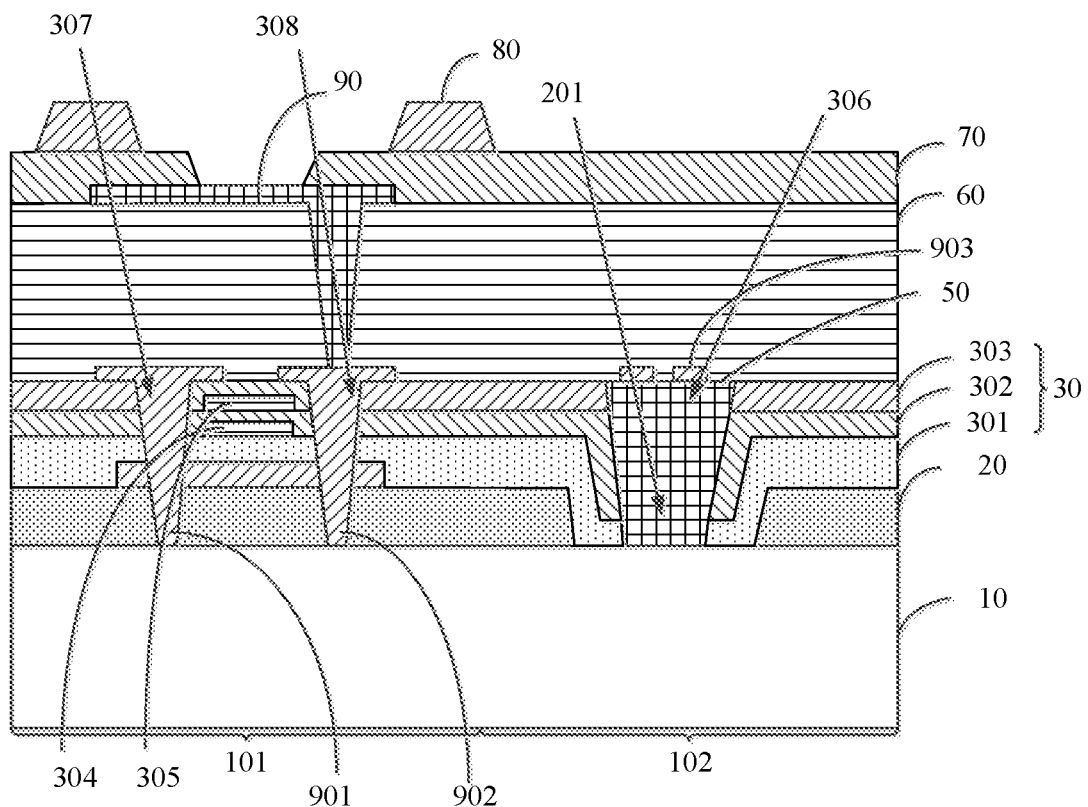

Referring to FIGS. 4, 7, and 8, in Step S401, a layer of an organic buffer material is deposited on a glass substrate to form the organic buffer layer 20. The organic buffer layer 20 is configured to shield poor results from the glass substrate 10 with drawbacks itself. Generally, the buffer layer 20 can be formed by depositing a silicon dioxide material using plasma chemical vapor deposition. Next, the thin-film transistor pattern 40 is formed on the organic buffer layer 20. Specifically, a material of thin-film transistors is deposited on the buffer layer 20. For example, the material of thin-film transistor can be monocrystal silicon, which are crystallized to form the thin-film transistor pattern 40 with polycrystal silicon. Specifically, excimer-laser annealing may be adopted to form the thin-film transistor pattern with polycrystal silicon. After that, the insulating layer 30 is formed on the organic buffer layer 20 and the thin-film transistor pattern 40 with polycrystal silicon. Details about this are referred to the afore-described embodiments and are not repeated herein.

Formation of the third photoresist pattern and the fourth photoresist pattern in Step S402 and formation of the third via hole 307 and the fourth via hole 308 in Step S403 are referred to the afore-described embodiments and are not repeated herein.

In Step S404, a source electrode is formed in the third via hole, a drain electrode is formed in the fourth via hole, and the source electrode and the drain electrode at least covers a part of the insulating layer. Specifically, after the third via hole 307 and the fourth via hole 308 are formed, the thin-film transistor 40 are slightly doped, and by ion implantation, a small amount of donors and acceptors are put into the third via hole 307 and the fourth via hole 308 to adjust a threshold voltage of the device. Then, a metal material is deposited on the insulating layer 30 to form the source electrode 901 in the third via hole and form the drain electrode 902 in the fourth via hole.

Preferably, the insulating layer includes a first insulating layer 301, a second insulating layer 302, and a third insulating layer 303 that are laminated one above another. In the display region, the substrate further includes a gate electrode 304 formed on the first insulating layer 301 and a pixel electrode 305 formed on the second insulating layer 302.

Correspondingly, referring to FIG. 8, the present disclosure further provides an array substrate including:

a substrate 10 including a display region 101 and a non-display region 102; and a buffer layer 20 and an insulating layer 30 that are laminated and disposed in the non-display region 102.

A first via hole 201 is disposed in the buffer layer 20, a second via hole 306 is disposed in the insulating layer 30, and the second via hole 306 is connected to the first via hole 201.

Preferably, the buffer layer 20, a thin-film transistor pattern 40, and the insulating layer 30 are laminated and disposed in the display region 101.

A third via hole 307 and a fourth via hole 308 penetrates the thin-film transistor pattern 40 and the insulating layer 30 and are disposed at two sides of the thin-film transistor pattern 40. A source electrode 901 is formed in the third via hole 307, a drain electrode 902 is formed in the fourth via hole, and the source electrode 901 and the drain electrode 902 at least covers a part of the insulating layer 30.

An organic flat layer 60, an anode 90, a pixel defining layer 70, and a spacer 80 are laminated and disposed on the source electrode 901 and the drain electrode 902. The organic flat layer 60 covers the source electrode 901 and the drain electrode 902.

Preferably, the insulating layer 30 at least partially covers the first via hole 201 and the cross-sectional area of the second via hole 306 is less than or equal to the cross-sectional area of the first via hole 201.

Preferably, the thickness of the first via hole 201 is between 0.7 micrometer and 0.9 micrometer and the thickness of the second via hole 306 is between 0.6 micrometer and 0.8 micrometer.

Preferably, the insulating layer 30 is made of polyimide resin or poly(methyl methacrylate).

In the present embodiment, the first via hole 201 is formed in the non-display region 102 and the second via hole 306 is formed on the basis of the first via hole 201. This ensures completeness of film layers, thereby improving product yield.

Detail descriptions of the array substrate and its manufacturing method provided in the embodiments of the present disclosure are presented above. Specific examples are used in the context in illustrating the principles and embodiments of the present disclosure. The descriptions of foregoing embodiments are only intended to facilitate understanding the present disclosure. Any modification made to the embodiments and applications may be made by persons of ordinary skills in the art based on ideas of the present disclosure. Above all, the present specification should not be understood as limitation to the present disclosure.

The invention claimed is:

1. A method for manufacturing an array substrate, comprising:
   forming a buffer layer on a substrate, the substrate comprising a display region and a non-display region;
   forming a first photoresist pattern on the buffer layer of the non-display region and removing a part of the buffer layer to form a first via hole in the non-display region;
   forming an insulating layer on the buffer layer of the non-display region and the first via hole; and
   forming a second photoresist pattern on the insulating layer of the non-display region and removing a part of the insulating layer to form a second via hole in the non-display region, the second photoresist pattern corresponding to the first via hole and the second via hole connected to the first via hole,
   wherein the insulating layer at least partially covers the first via hole and a cross-sectional area of the second via hole is less than or equal to a cross-sectional area of the first via hole, and
   wherein a thickness of the first via hole is between 0.7 micrometer and 0.9 micrometer and a thickness of the second via hole is between 0.6 micrometer and 0.8 micrometer.

2. The method according to claim 1, wherein after the step of removing the part of the insulating layer to form the second via hole in the non-display region, the method further comprises:
   filling an organic material into the first via hole and the second via hole to form an organic insulating layer in the first via hole and the second via hole, wherein the organic insulating layer contacts the substrate via the first via hole and the second via hole; and
   sequentially forming a metal layer, an organic flat layer, and a pixel defining layer on the organic insulating layer.

3. The method according to claim 2, wherein the step of forming the first photoresist pattern on the buffer layer of the non-display region and removing the part of the buffer layer to form the first via hole in the non-display region comprises:
   forming a first photoresist layer on the buffer layer of the non-display region and processing the first photoresist layer by exposure and development to form the first photoresist pattern on the buffer layer of the non-display region; and
   etching the buffer layer uncovered by the first photoresist pattern to form the first via hole in the non-display region.

4. The method according to claim 2, wherein the step of forming the second photoresist pattern on the insulating layer of the non-display region and removing the part of the insulating layer to form the second via hole in the non-display region comprises:
   forming a second photoresist layer on the insulating layer of the non-display region and processing the second photoresist layer by exposure and development to form the second photoresist pattern on the insulating layer of the non-display region; and
   etching the insulating layer uncovered by the second photoresist pattern to form the second via hole in the non-display region.

5. The method according to claim 4, further comprising:
   sequentially forming a thin-film transistor pattern and the insulating layer on the buffer layer of the display region;
   forming the second photoresist layer on the insulating layer and processing the second photoresist layer by the exposure and the development to form a third photoresist pattern and a fourth photoresist pattern on the insulating layer of the display region; and
   removing the insulating layer uncovered by the third photoresist pattern and the fourth photoresist pattern to form a third via hole and a fourth via hole in the display region,
   wherein the third via hole and the fourth via hole run through the thin-film transistor pattern and the insulating layer and are disposed at two sides of the thin-film transistor pattern,
   wherein a source electrode is formed in the third via hole, a drain electrode is formed in the fourth via hole, and the source electrode and the drain electrode at least covers a part of the insulating layer, and
   wherein an organic flat layer, an anode, a pixel defining layer, and a spacer are sequentially formed on the source electrode and the drain electrode.

6. The method according to claim 1, wherein the insulating layer is made of polyimide resin or poly(methyl methacrylate).

7. The method according to claim 1, wherein a flexible material is filled into the first via hole and the second via hole to increase flexibility of the array substrate.

8. A method for manufacturing an array substrate, comprising:
   forming a buffer layer on a substrate, the substrate comprising a display region and a non-display region;
   forming a first photoresist pattern on the buffer layer of the non-display region and removing a part of the buffer layer to form a first via hole in the non-display region;
   forming an insulating layer on the buffer layer of the non-display region and the first via hole; and
   forming a second photoresist pattern on the insulating layer of the non-display region and removing a part of the insulating layer to form a second via hole in the non-display region, wherein the second photoresist pattern corresponds to the first via hole and the second via hole is connected to the first via hole.

9. The method according to claim 8, wherein after the step of removing the part of the insulating layer to form the second via hole in the non-display region, the method further comprises:
   filling an organic material into the first via hole and the second via hole to form an organic insulating layer in the first via hole and the second via hole, wherein the organic insulating layer contacts the substrate via the first via hole and the second via hole; and
   sequentially forming a metal layer, an organic flat layer, and a pixel defining layer on the organic insulating layer.

10. The method according to claim 9, wherein the step of forming the first photoresist pattern on the buffer layer of the non-display region and removing the part of the buffer layer to form the first via hole in the non-display region comprises:
    forming a first photoresist layer on the buffer layer of the non-display region and processing the first photoresist layer by exposure and development to form the first photoresist pattern on the buffer layer of the non-display region; and etching the buffer layer uncovered by the first photoresist pattern to form the first via hole in the non-display region.

11. The method according to claim 9, wherein the step of forming the second photoresist pattern on the insulating layer of the non-display region and removing the part of the insulating layer to form the second via hole in the non-display region comprises:

forming a second photoresist layer on the insulating layer of the non-display region and processing the second photoresist layer by exposure and development to form the second photoresist pattern on the insulating layer of the non-display region; and etching the insulating layer uncovered by the second photoresist pattern to form the second via hole in the non-display region.

12. The method according to claim 11, further comprising:

sequentially forming a thin-film transistor pattern and the insulating layer on the buffer layer of the display region;

forming the second photoresist layer on the insulating layer and processing the second photoresist layer by the exposure and the development to form a third photoresist pattern and a fourth photoresist pattern on the insulating layer of the display region; and removing the insulating layer uncovered by the third photoresist pattern and the fourth photoresist pattern to form a third via hole and a fourth via hole in the display region, wherein the third via hole and the fourth via hole run through the thin-film transistor pattern and the insulating layer and are disposed at two sides of the thin-film transistor pattern, wherein a source electrode is formed in the third via hole, a drain electrode is formed in the fourth via hole, and the source electrode and the drain electrode at least covers a part of the insulating layer, and wherein an organic flat layer, an anode, a pixel defining layer, and a spacer are sequentially formed on the source electrode and the drain electrode.

\* \* \* \* \*